United States Patent [19]

Platzer et al.

[11] Patent Number: 4,935,331

[45] Date of Patent: Jun. 19, 1990

[54] PIGMENT TRANSFER TO PHOTOPOLYMERIZABLE POSITIVE-WORKING IMAGING SYSTEM

[75] Inventors: Stephan J. W. Platzer, Califon; Stanley F. Wanat, Scotch Plains, both of N.J.

[73] Assignee: Hoechst Celanese Corporation, Somerville, N.J.

[21] Appl. No.: 261,382

[22] Filed: Oct. 21, 1988

[51] Int. Cl.$^5$ .............................................. G03C 3/00
[52] U.S. Cl. .................................. 430/254; 430/256; 430/257; 430/258; 430/260; 430/253; 430/292; 430/293
[58] Field of Search ............... 430/256, 257, 258, 260, 430/253, 254, 292, 293

[56] References Cited

U.S. PATENT DOCUMENTS

| | | | |
|---|---|---|---|
| 3,060,023 | 10/1962 | Burg et al. | 96/28 |
| 4,081,282 | 3/1978 | Merrill et al. | 96/77 |
| 4,275,140 | 6/1981 | Neiss | 430/254 |
| 4,288,525 | 9/1981 | Shepherd et al. | 96/77 |
| 4,489,154 | 12/1984 | Taylor, Jr. | 430/253 |
| 4,596,757 | 6/1986 | Barton et al. | 430/257 |
| 4,806,451 | 2/1989 | Fröhlich | 430/292 |

*Primary Examiner*—Paul R. Michl
*Assistant Examiner*—Cynthia Hamilton
*Attorney, Agent, or Firm*—Plottel & Roberts

[57] ABSTRACT

This invention relates to a method for making a dry transfer, photopolymerizable positive-working imaging system which provides a photopolymerizable layer on a support and a colored layer on a substrate. Upon imagewise exposure of the photopolymerizable layer, subsequent lamination of the colored layer to the photopolymerized layer and peel apart, a colored image is produced due to the preferred adhesion of the colored layer to the nonexposed areas of the photopolymerized layer.

22 Claims, No Drawings

PIGMENT TRANSFER TO PHOTOPOLYMERIZABLE POSITIVE-WORKING IMAGING SYSTEM

BACKGROUND OF THE INVENTION

In the graphic arts, it is desirable to produce a three or more color proof to assist in correcting a set of color separation films prior to using them to produce printing plates. The proof should reproduce the color quality that will be obtained during the printing process. The proof must be a consistent duplicate of the desired halftone image. Visual examination of a color proof should show the color rendition to be expected from press printing using the color separations and any defects on the separations which might need to be altered before making the printing plates.

Color proofing sheets for multicolored printing can be made by using a printing press or proof press. This requires that all of the actual printing steps be performed. Therefore, this conventional method of color proofing is costly and time consuming.

Photoimaging processes can also be used to produce a color proof. There are two general types of photoimaging methods; namely the overlay type and the single sheet type.

In the overlay type of color proofing method, an independent transparent plastic support is used for producing an image of each color separation film by applying a photosensitive solution of the corresponding color. A plurality of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This can be accomplished by sequentially applying colorants or colored, photosensitive layers to a single opaque support. This method more closely resembles the actual printing process and eliminates the color distortion inherent in the overlay system. Examples of such single sheet approaches are contained in U.S. Pat. Nos. 3,671,236; 4,260,673; 4,366,223; 4,650,738; 4,656,114; and 4,659,642.

U.S. Pat. No. 3,574,049 provides a thermal transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design. The affinity of the matter of the design towards the final support is greater than its affinity towards the temporary support. This process has the disadvantage of a printing step.

Various processes for producing single sheet color proofs of an image embodying thermal transfer and photopolymerization techniques are known, for example, from U.S. Pat. Nos. 3,060,023; 3,060,024; 3,060,025; 3,481,736; and 3,607,264. In these processes, a photopolymerizable layer coated on a suitable support is imagewise exposed through a color separation film. The surface of the exposed layer is then pressed into contact with an image receptive surface of a separate element. At least one of the said elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material.

In U.S. Pat. No. 3,721,557, a method for transferring colored images is claimed which provides a stripping layer coated between a photosensitive element and a support. When the photosensitive layer is exposed to actinic light and developed, the more soluble portions are selectively removed to produce a visible image. The image-carrying support is pressed against a suitable adhesive coated receptor member and the carrier support is subsequently stripped to accomplish the transfer of the image. A fresh layer of adhesive must be applied to the receptor for each subsequent transfer.

U.S. Pat. No. 4,596,757 provides a method for transferring images or solid colors which are subsequently imaged. The photosensitive material comprises a carrier support having sequentially disposed thereon a release layer; a colored, photopolymerizable layer; and an adhesive layer. The material can undergo exposure, lamination to a temporary support, wet development, and then lamination to a receptor sheet. Alternatively, the photosensitive material can be laminated to a receptor sheet, undergo exposure, and then wet processed. Both processes require development in an aqueous medium.

In U.S. Pat. No. 3,649,268, a process is claimed which produces a single layer color proof without wet development. The photosensitive material comprises a removable support and a photohardenable layer. The material is laminated to a suitable receptor, imagewise exposed through the support, stripped of its support, and treated with toners. The exposed areas are photohardened and lose their tackiness. The toners only adhere to the unexposed, tacky areas. The toner can be applied by a dusting technique as disclosed in U.S. Pat. No. 3,060,024 or by transfer as disclosed in U.S. Pat. No. 3,060,025. By repeating the laminating, exposing, removing, and toning, a multicolor image can be obtained.

The use of a transfer layer for toning is simpler, cleaner, and less polluting than dusting with finely divided powders, either by hand or using automatic applicators. Furthermore, the transfer method gives a more uniform, colored layer over a large surface in comparison to that obtained with the dusting method. Therefore, transfer methods have been devised such as described in European Patent 0,255,032, in which the binder for the transfer layer consists of two incompatible polymers. The present invention improves upon this by providing a fragile transfer layer with a single polymer or compatible polymers.

SUMMARY OF THE INVENTION

The present invention provides a positive-acting proofing method which comprises, in order:

A. providing a photosensitive element which comprises, in order:
  i. a transparent, removable support; and
  ii. a single photosensitive composition layer on said support, which photosensitive layer comprises an organic binding resin, a photoinitiator, and a free radical polymerizable acrylate or methacrylate component having at least two ethylenically unsaturated groups, wherein said binding resin is present in sufficient amount to bind the composition components into a uniform film, and wherein said photoinitiator is present in sufficient amount to initiate the free radical polymerization of said polymerizable components upon exposure to sufficient actinic radiation, and wherein said polymerizable component is present in sufficient amount to provide image differentiation when the composition is imagewise exposed to actinic radiation; and B. providing a colored transfer element which comprises:
  i. a removable substrate; and
  ii. a single, colored transfer layer on said removable substrate, which colored transfer layer comprises at least one colorant in sufficient amount to uniformly color the layer; and at least one organic binding resin with a glass transition temperature greater than the laminating temperature and an elongation at break of less than 10%; and C. laminating at elevated temperature and pressure said photosensitive element to a receiver base via the photosensitive layer; and D. imagewise exposing said photosensitive composition through the transparent support to actinic radiation; and E. removing said transparent support; and F. laminating at elevated temperature and pressure said transfer element to the exposed photosensitive layer via the colored transfer layer; and G. peeling apart said substrate and said receiver base, thereby transferring portions of the colored transfer layer to the imagewise nonexposed areas of the photosensitive layer on the receiver base while the portions of the colored transfer layer corresponding to the exposed areas of the photosensitive layer remain on the transfer substrate; and H. optionally repeating steps A. through G. at least once with another photosensitive element and another transfer element having at least one different colorant transferred on the colored, imagewise nonexposed portions of the previously processed photosensitive element on said receiver base.

DETAILED DESCRIPTION OF THE PREFERRED EMBODIMENT

In the usual full color proofing guide, four distinct colored images are formed, namely magenta, cyan, yellow, and black. When the images are superimposed upon each other, a simulated full color reproduction results. As hereinbefore described, one begins the process of the present invention by preparing a photosensitive element and a colored transfer element.

The photosensitive element comprises a support and a photopolymerizable layer. In the preferred embodiment, the support may be composed of any suitable flexible sheet material provided it is transparent to the actinic radiation for the photopolymerizable layer. It should also preferably be dimensionally stable when treated with the herein specified processes. That is, it should have substantially no charge in dimensions under heating in the range of approximately 60° C. to 120° C. during lamination. One preferred material is polyethylene terephthalate. In the usual case, it has a thickness of approximately 0.002 to 0.020 cm, or a more preferred thickness of approximately 0.005 to 0.008 cm. Suitable supports nonexclusively include Hostaphan 3000 available from Hoechst Celanese; Mylar D available from DuPont; and Melinex 516 available from ICI. The surface of the support may be smooth or it may be provided with a matte texture as with Melinex 475. A smooth surface is preferred because a rough surface scatters the actinic radiation and thereby reduces the resolution capability of the photosensitive element.

The support must have a release surface, that is, it must be capable of releasably holding the photosensitive layer thereto. This may be accomplished either by the support surface being inherently releasable, being rendered releasable by a suitable treatment or being provided with a release layer over the support surface. Such release layers stay with the transparent support when the support is separated from the receiver sheet. They may comprise polyvinyl alcohol or poly(dimethyl siloxane).

The photosensitive layer is applied from a solvent coating composition to the release surface of the support. Organic solvents are preferred for the photosensitive coating because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, and gamma-butyrolactone.

A typical photosensitive layer comprises a photopolymerizable monomer, photoinitiator, binder, and optional ingredients.

The photopolymerizable material contained in the photosensitive layer preferably comprises an additional polymerizable, nongaseous (boiling temperature above 100° C. at normal atmospheric pressure), ethylenically-unsaturated compounds containing at least two terminal ethylene groups, and being capable of forming a high molecular weight polymer by free radical initiated, chain propagating addition polymerization. Suitable polymerizable materials nonexclusively include triethylene glycol dimethacrylate, tripropylene glycol diacrylate, tetraethylene glycol dimethacrylate, diethylene glycol dimethacrylate, 2,4-butanediol diacrylate, 1,6-hexanediol dimethacrylate, pentaerythritol tetraacrylate, trimethylol propane triacrylate, trimethylol propane trimethacrylate, dipentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

Free radical liberating photoinitiators include any compound which liberates free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon-substituted aromatic acyloins in U.S. Pat. No.

2,722,512; polynuclear quinones in U.S. Pat. Nos. 2,951,758 and 3,046,127; and s-triazines in U.S. Pat. No. 4,656,272.

The photosensitive layer also contains at least one binder which not only determines the hardness and flexibility of the coating but is also used to control the tackiness. Binders found suitable for the photosensitive layer are thermoplastic resins or mixtures thereof which nonexclusively include styrene/maleic anhydride copolymers and their half esters; acrylic polymers and copolymers; polyamides; polyvinyl pyrrolidones; cellulose and its derivatives; phenolic resins; and the like. Preferred binders are polyvinyl acetals, such as polyvinyl formals, polyvinyl butyral, and polyvinyl propional. The most preferred binders are polyvinyl acetate and its copolymers. Useful vinyl acetate resins are available from Hoechst AG as Mowilith. These resins have an average molecular weight between 35,000 and 2,000,000. They have a softening temperature between 80° and 180° C. The binder should have a softening temperature in the range of approximately 40° to 200° C., more preferably between 60° and 120° C.

Dyes may be included to spectrally sensitize the photoinitiator, such as described in U.S. Pat. Nos. 4,282,309 and 4,454,218, and European Patent Applications 0,179,448 and 0,211,615.

Other ingredients which may be present in the photosensitive layer are thermal polymerization inhibitors, plasticizers, oligomers, residual solvents, surfactants, inert fillers, antihalation agents, hydrogen atom donors, photoactivators, and optical brightening agents.

In the preferred embodiment, the dry photosensitive layer has a coating weight range between about 0.1 to about 10 g/m$^2$. The more preferred coating weight is between approximately 0.4 and 4 g/m$^2$. The thickness of the layer may be adjusted to regulate the apparent dot size of the final proof.

In the practice of the present invention, the photopolymerizable monomer component is preferably present in the photosensitive layer in an amount ranging from approximately 10 to 60% based on the weight of the solids in the layer. A more preferred range is from approximately 15 to 40%

In the practice of the present invention, the photoinitiator component is preferably present in the photosensitive layer in an amount ranging from approximately 2 to 30% based on the weight of the solids in the layer. A more preferred range is from approximately 6 to 20%.

In the practice of the present invention, the binder component is preferably present in the photosensitive layer in an amount ranging from approximately 10 to 75% based on the weight of the solids in the layer. A more preferred range is from approximately 20 to 50%.

The transfer element comprises a substrate with a single, colored transfer layer on it. The substrate may be composed of any suitable flexible sheet material. It should be dimensionally stable when treated with the herein specified processes. It can be transparent or opaque, colored or colorless. One preferred material is polyethylene terephthalate. It has a thickness and release surface similar to that of the photosensitive support. Suitable substrates nonexclusively include Hostaphan 3000 available from Hoechst Celanese; Mylar D available from DuPont; and Melinex 516 available from ICI.

The colored transfer layer is generally applied from a solvent coating composition to the release surface of the substrate. A typical transfer layer comprises at least one colorant and one binder.

Colorants are included in the colored transfer layer to provide color to the image areas after exposure. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer.

Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850: 1), Permanent Pink F3B (C.I. 12433), Hostaperm Pink E (C.I. 73915), Hostaperm Red Violet ER (C.I. 46500), Permanent Carmine FBB (C.I. 12485), Hostaperm Blue B2G (C.I. 74160), Hostaperm Blue A2R (C.I. 74160), and Printex 25. Most of these pigments are products of Hoechst AG. They can be used separately or blended for a desired color.

In the practice of the present invention, the colorant component is preferably present in the transfer layer in an amount ranging from about 15% to about 80% based on the weight of the solids in the layer. A more preferred range is from about 30% to about 70%.

The colored transfer layer also contains at least one binder which is used to control the brittleness of the layer. In the preferred embodiment, the transfer layer is fragile to obtain maximum resolution. Binders found suitable for this layer are thermoplastic resins or compatible mixtures thereof. Preferred binders have a glass transition temperature greater than the laminating temperature, i.e., above approximately 90° C., and an elongation at break of less than 10%. Suitable binders nonexclusively include styrene/maleic anhydride copolymers and their half esters; and acrylic polymers and their copolymers. Examples of half esters are Scripset 540 available from Monsanto and SMA 2625 available from ARCO. Examples of acrylic resins are methyl methacrylate resins such as Elvacite 2008 and 2021 available from DuPont. Examples of acrylic copolymers are methyl methacrylate/methacrylic acid resins available from Esschem.

The binders are also used to stabilize the pigments in dispersions. Typically the pigment with the binder or a portion of the binder is ground in a mill until the desired particle size and color is reached. The ground paste is then diluted with solvent or solvent mixture to obtain a workable viscosity.

In the preferred embodiment, the dry transfer layer has a coating weight range between approximately 0.1 and 10 g/m$^2$. The more preferred coating weight is between approximately 0.4 and 4 g/m$^2$.

Receiver bases may comprise virtually any material which can withstand the laminating process. White plastic sheets, such as adhesion pretreated polyester Melinex 3020 from ICI, are useful for this purpose. Plastic coated paper sheets, such as polyethylene coated paper from Schoeller, may also be used. Other bases may include paper, wood, glass, metal, and the like.

The first lamination may be conducted by putting the photosensitive element and receiver base in contact via the photosensitive layer and then introducing the materials into the nip of a pair of heated laminating rollers under suitable pressure. Suitable laminating temperatures usually range from approximately 60° to 120° C., or preferably from 70° to 100° C.

The photosensitive layer is then exposed by means well known in the art. Such exposure may be conducted by exposure to actinic radiation from a light source through a conventional halftone positive color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

After exposure, the transparent support is typically peeled away using merely manual force thus transferring both the exposed and nonexposed areas to the receiver base. The transfer element is then laminated to the exposed photosensitive layer via the transfer layer. Lamination may be conducted as is done with the first lamination.

After the second lamination, the transfer substrate is peeled away from the receiver sheet. The nonexposed tacky areas of the photosensitive layer hold onto the corresponding colored transfer layer while the exposed, nontacky areas do not hold onto the corresponding colored transfer layer. Therefore after peel apart, the nonexposed areas are colored and the exposed areas are not.

Another photosensitive element is laminated onto the first image on the receiver base via the second photosensitive layer. This second photosensitive layer is exposed through the appropriate color separation and then its support is removed as was done with the first support. Another transfer element with preferably a different color than the first is laminated to the exposed second photosensitive layer as before. The transfer substrate and receiver base are pulled apart leaving the second image on top of the first image on the receiver base. A third and fourth image may be added in a manner similar to that used to produce the second image. In the usual case, four colored layers are employed to produce a full color reproduction of a desired image. These four colors are cyan, magenta, yellow, and black.

A matte finish of the final image may be obtained by embossing the shiny, top surface of the image with a matte materials, such as Melinex 377 from ICI. This is done by laminating together the final image and matte material. The matte material is then generally removed after lamination. The advantage of this method is that the finish of the final proof can be determined by careful selection of the matting material.

The final four color proof may be given a uniform, blanket exposure to photoharden the nonexposed areas on the receiver base. A protective layer may also be laminated on top of the last photosensitive layer.

The following nonlimiting examples serve to illustrate the invention:

EXAMPLE 1

The formulation for the photosensitive layer includes the following ingredients in parts by weight, as indicated:

| Tetrahydrofuran | 200 |
| --- | --- |
| 4-Hydroxy-4-methyl-2-pentanone | 150 |
| 1-Methoxy-2-propanol | 400 |
| gamma-Butyrolactone | 50 |
| Mowilith 30 | 12 |
| Trimethylol propane triacrylate | 8 |

| -continued | |
| --- | --- |
| 2,3-Di(4-methoxyphenyl)quinoxaline | 4 |

The photosensitive solution is coated and dried on four 0.008 cm thick Melinex 516 transparent polyester supports. The dry coating weight is 2 g/m².

The formulations for the transfer layers include the following ingredients in parts by weight, as indicated:

|  | Cyan | Yellow | Magenta | Black |
| --- | --- | --- | --- | --- |
| Tetrahydrofuran | 200 | 200 | 200 | 200 |
| 4-Hydroxy-4-methyl-2-pentanone | 150 | 150 | 150 | 150 |
| 1-Methoxy-2-propanol | 400 | 400 | 400 | 400 |
| gamma-Butyrolactone | 50 | 50 | 50 | 50 |
| 2-Butanone | 84 | 89 | 90 | 90 |
| Scripset 540 | 11 | 6 | 5 | 4 |
| Hostaperm Blue B2G | 5 | — | — | — |
| Permanent Yellow GR | — | 5 | — | — |
| Permanent Red FBB | — | — | 5 | — |
| Printex 25 | — | — | — | 6 |

The transfer solutions are coated and dried on four 0.008 cm thick Melinex 516 transparent polyester substrates. The optical densities are 1.3, 0.9, 1.3, and 1.6 for cyan, yellow, magenta, and black respectively.

One of the photosensitive elements is laminated at 80° C. to Champion Kromekote 1S receiver paper via the photosensitive layer. The photosensitive layer is exposed through the support and a cyan, positive color separation. The support is peeled away, leaving both the exposed and nonexposed areas of the photosensitive layer on the receiver sheet. The cyan transfer element is then laminated at the same temperature to the exposed layer via the transfer layer. The transfer substrate is peeled away from the receiver sheet, leaving cyan on the nonexposed portions of the photosensitive layer on the receiver sheet while the portions corresponding to the exposed areas remain on the substrate.

The next photosensitive element is laminated to the cyan image on the receiver sheet via the photosensitive layer. It is exposed using a yellow color separation. The support is then removed and the yellow transfer element is laminated to the exposed photosensitive layer. The substrate is removed, resulting in a yellow image on top of a cyan image. The yellow is followed in a like manner by magenta and then by black to give a four color image on paper. This final proof is an accurate reproduction of the original from which the separations are prepared.

EXAMPLE 2

Photosensitive elements are made according to the procedures in Example 1. The formulations for the transfer layers are different from those in Example 1, and include the following ingredients:

|  | Cyan | Yellow | Magenta | Black |
| --- | --- | --- | --- | --- |
| Tetrahydrofuran | 200 | 200 | 200 | 200 |
| 4-Hydroxy-4-methyl-2-pentanone | 150 | 150 | 150 | 150 |
| 1-Methoxy-2-propanol | 400 | 400 | 400 | 400 |
| gamma-Butyrolactone | 50 | 50 | 50 | 50 |
| 2-Butanone | 64 | 69 | 67 | 67 |
| Polymethylmethacrylate/methacrylic acid (85/15) | 26 | 26 | 26 | 28 |
| Hostaperm Blue B2G | 10 | — | — | — |
| Permanent Yellow GR | — | 5 | — | — |

-continued

|  | Cyan | Yellow | Magenta | Black |
|---|---|---|---|---|
| Permanent Red FBB | — | — | 7 | — |
| Printex 25 | — | — | — | 5 |

The transfer solutions are coated and dried on four 0.008 cm thick Hostaphan 3000 to the same optical densities as used in Example 1.

One of the photosensitive elements is laminated at 80° C. to a Melinex 3020 white, opaque polyester receiver sheet. The photosensitive layer is exposed with the black, positive color separation. The support is peeled away and the black transfer element is laminated to the exposed photosensitive layer. The transfer substrate is peeled away, leaving a positive black image on the receiver sheet.

Another photosensitive element is laminated and exposed with the yellow color separation. The support is removed and the yellow transfer element is laminated to the exposed photosensitive layer. The substrate is peeled off, resulting in a yellow image on top of a black image. The yellow is followed in a like manner by cyan and then by magenta to give a four color proof. This proof can be used to determine if any defects are present in the color separations.

What is claimed is:

1. A method for forming a colored image which comprises, in order:
   A. providing a photosensitive element which comprises, in order:
      i. a transparent, removable support; and
      ii. a single photosensitive composition layer on said support, which photosensitive layer comprises an organic binding resin, a photoinitiator, and a free radical polymerizable acrylate or methacrylate component having at least two ethylenically unsaturated groups, wherein said binding resin is present in sufficient amount to bind the composition components into a uniform film, and wherein said photoinitiator is present in sufficient amount to initiate the free radical polymerization of said polymerizable components upon exposure to sufficient actinic radiation, and wherein said polymerizable component is present in sufficient amount to provide image differentiation when the composition is imagewise exposed to actinic radiation; and
   B. providing a colored transfer element which comprises:
      i. a removable substrate; and
      ii. a single, colored transfer layer on said removable substrate, which colored transfer layer comprises at least one colorant in sufficient amount to uniformly color the layer; and at least one organic binding resin each with a glass transition temperature greater than the laminating temperature and an elongation at break of less than 10%; and
   C. laminating at elevated temperature and pressure said photosensitive element to a receiver base via the photosensitive layer; and
   D. imagewise exposing said photosensitive composition through the transparent support to actinic radiation; and
   E. removing said transparent support; and
   F. laminating at elevated temperature and pressure said transfer element to the exposed photosensitive layer via the colored transfer layer; and
   G. peeling apart said substrate and said receiver base, thereby transferring portions of the colored transfer layer to the imagewise nonexposed areas of the photosensitive layer on the receiver base while the portions of the colored transfer layer corresponding to the exposed areas of the photosensitive layer remain on the transfer substrate; and
   H. optionally repeating steps A. through G. at least once with another photosensitive element and another transfer element having at least one different colorant transferred on the colored, imagewise nonexposed portions of the previously processed photosensitive element on said receiver base.

2. The method of claim 1 wherein said support and substrate comprises polyethylene terephthalate.

3. The method of claim 1 wherein said receiver base comprises paper, coated paper, or polymeric film.

4. The method of claim 1 wherein said photosensitive composition comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, dipentaerythritol monohydroxypentaacrylate, pentaerthritol triacrylate, bisphenol A ethoxylate dimethacrylate, trimethylolpropane ethoxylate triacrylate, and trimethylolpropane propoxylate triacrylate.

5. The method of claim 1 wherein said photosensitive composition comprises one or more photoinitiators selected from the group consisting of 2,3-di(4-methoxyphenyl)quinoxaline, 9-phenylacridine, bis(2,4,5-triphenyl)imidazole, and their derivatives.

6. The method of claim 1 wherein said binding resin in the photosensitive layer comprises one or more thermoplastic resins selected from the group consisting of styrene/maleic anhydride copolymers and their half esters; acrylic polymers and copolymers; polyamides; polyvinyl pyrrolidones; cellulosic resins; phenolic resins; polyvinyl acetals; and polyvinyl acetate.

7. The method of claim 1 wherein said photosensitive composition further comprises one or more ingredients selected from the group consisting of spectral sensitizers, thermal polymerization inhibitors, plasticizers, oligomers, surfactants, inert fillers, antihalation agents, hydrogen atom donors, photoactivators, and optical brightening agents.

8. The method of claim 1 wherein the dry coating weight of said photosensitive layer ranges from about 0.1 $g/m^2$ to 10 $g/m^2$.

9. The method of claim 1 wherein the acrylate or methacrylate component is present in said photosensitive layer in an amount ranging from about 10% to about 60% by weight of the photosensitive composition.

10. The method of claim 1 wherein the photoinitiator component is present in said photosensitive layer in an amount ranging from about 2% to about 30% by weight of the photosensitive composition.

11. The method of claim 1 wherein the binder component is present in said photosensitive layer in an amount ranging from about 10% to about 75% by weight of the photosensitive composition.

12. The method of claim 1 wherein said colorant in the transfer layer comprises one or more pigments.

13. The method of claim 1 wherein the colorant component is present in said transfer layer in an amount ranging from about 15% to about 80% by weight of the transfer composition.

14. The method of claim 1 wherein said binding resin in the transfer layer comprises one or more thermoplastic polymers having a glass transition temperature greater than 90° C.

15. The method of claim 1 wherein said binding resin in the transfer layer comprises one or more resins selected from the group consisting of styrene/maleic anhydride copolymers and their half esters, and acrylic polymers and their copolymers.

16. The method of claim 1 wherein said binding resin is present in the said transfer layer in an amount of at least about 50% by weight of said transfer layer.

17. The method of claim 1 wherein the dry coating weight of the said transfer layer ranges from about 0.1 g/m$^2$ to about 10 g/m$^2$.

18. The method of claim 1 wherein said lamination is conducted at a temperature of from about 60° C. to about 120° C.

19. The method of claim 1 further comprising the subsequent step of providing a protective covering on the imagewise nonexposed portions of the photosensitive layer on the receiver sheet.

20. The method of claim 1 wherein steps A. through G. are conducted three additional times to produce a four-color reproduction.

21. The method of claim 20 further comprising the subsequent step of providing a protective covering on the four-color reproduction.

22. The method of claim 20 further comprising the subsequent step of a uniform blanket exposure to photoharden the nonexposed areas.

* * * * *